United States Patent
Mueller-Mach et al.

(10) Patent No.: US 6,680,569 B2
(45) Date of Patent: *Jan. 20, 2004

(54) RED-DEFICIENCY COMPENSATING PHOSPHOR LIGHT EMITTING DEVICE

(75) Inventors: Regina B. Mueller-Mach, San Jose, CA (US); Gerd O. Mueller, San Jose, CA (US); Tomas Jüestel, Aachen (DE); Peter Schmidt, Aachen (DE)

(73) Assignee: Lumileds Lighting U.S. LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/083,314

(22) Filed: Feb. 25, 2002

(65) Prior Publication Data

US 2003/0006702 A1 Jan. 9, 2003

Related U.S. Application Data

(63) Continuation-in-part of application No. 09/252,207, filed on Feb. 18, 1999, now Pat. No. 6,351,069.

(51) Int. Cl.⁷ .................................................. H01J 1/62
(52) U.S. Cl. ........................ 313/502; 313/503; 313/506; 313/501
(58) Field of Search ................................ 313/467, 486, 313/501, 502, 503, 506; 252/301.4 F, 301.4 S; 257/89, 102, 103

(56) References Cited

U.S. PATENT DOCUMENTS

| | | | |
|---|---|---|---|
| 5,102,579 A | 4/1992 | Inaho et al. | 252/301.4 |
| 5,898,185 A | 4/1999 | Bojarczuk, Jr. et al. | 257/103 |
| 6,066,861 A | 5/2000 | Höhn et al. | 257/99 |
| 6,071,432 A | 6/2000 | Yocom et al. | 252/301.45 |
| 6,234,648 B1 * | 5/2001 | Borner et al. | 362/235 |
| 6,252,254 B1 * | 6/2001 | Soules et al. | 257/89 |

FOREIGN PATENT DOCUMENTS

| | | | |
|---|---|---|---|
| DE | 2 260 285 | 6/1993 | H05B/33/16 |
| DE | 691 12 459 T1 | 5/1996 | |
| DE | 196 38 667 A1 | 4/1998 | |
| EP | 0 890 996 | 1/1999 | H01L/33/00 |
| JP | 7-99345 | 4/1995 | H01L/33/00 |
| JP | WO 98/05078 | 2/1998 | H01L/33/00 |
| WO | WO 97/48138 | 12/1997 | H01L/33/00 |
| WO | WO 98/39805 | 9/1998 | H01L/33/00 |
| WO | WO 99/02026 | 1/1999 | |
| WO | WO 00/33389 | 6/2000 | H01L/33/00 |
| WO | WO 00/33390 | 6/2000 | H01L/33/00 |
| WO | WO 01/39574 A1 | 6/2001 | |

OTHER PUBLICATIONS

English Language Translation corresponding to German Application No. DE 196 38 667, 26 pages.
English Language Abstract corresponding to PCT Application No. WO98/05078, 1 page.

* cited by examiner

Primary Examiner—Ashok Patel
Assistant Examiner—Jason Phinney
(74) Attorney, Agent, or Firm—Patent Law Group LLP; Rachel V. Leiterman

(57) ABSTRACT

A light emitting device includes a light source that emits first light in response to an electrical signal, and a fluorescent layer positioned over the light source. The fluorescent layer includes a first fluorescent material which radiates second light and a second fluorescent material which radiates third light. In one embodiment, the second fluorescent material contains europium activated calcium sulfide. In another embodiment, the second fluorescent material contains europium activated nitrido-silicate. In some embodiments, the device includes a light propagation medium which transmits the first, second, and third light as composite output.

25 Claims, 5 Drawing Sheets

RED-DEFICIENCY COMPENSATING PHOSPHOR LIGHT EMITTING DEVICE

CROSS REFERENCE TO RELATED APPLICATION

This application is a continuation in part of U.S. patent application Ser. No. 09/252,207 filed on Feb. 18, 1999, now U.S. Pat. No. 6,351,069. U.S. Pat. No. 6,351,069 is incorporated herein by reference in its entirety.

FIELD OF INVENTION

The invention relates generally to light emitting devices and more particularly to a phosphor light emitting diode.

DESCRIPTION OF THE RELATED ART

Light emitting devices (LEDs) including light emitting diodes, are well-known solid state devices that can generate light having a peak wavelength in a specific region of the light spectrum. LEDs are typically used as illuminators, indicators and displays. Traditionally, the most efficient LEDs emit light having a peak wavelength in the red region of the light spectrum, i.e., red light. However, a type of LED based on Gallium Nitride (GaN) has recently been developed that can efficiently emit light having a peak wavelength in the blue region of the spectrum, i.e., blue light. This new type of LED can provide significantly brighter output light than traditional LEDs.

In addition, since blue light has a shorter wavelength than red light, the blue light generated by the GaN-based LEDs can be readily converted to produce light having a longer wavelength. It is well known in the art that light having a first peak wavelength (the "primary light") can be converted into light having a longer peak wavelength (the "secondary light") using a process known as fluorescence. The fluorescent process involves absorbing the primary light by a photoluminescent phosphor material, which excites the atoms of the phosphor material, and emits the secondary light. The peak wavelength of the secondary light will depend on the phosphor material. The type of phosphor material can be chosen to yield secondary light having a particular peak wavelength. An LED that utilizes the fluorescent process will be defined herein as a "phosphor LED."

With reference to FIG. 1, a prior art phosphor LED 10 is shown. The LED 10 includes a GaN die 12 that generates blue primary light when activated. The GaN die 12 is positioned on a reflector cup lead frame 14 and is electrically coupled to leads 16 and 18. The leads 16 and 18 conduct electrical power to the GaN die 12. The GaN die 12 is covered by a layer 20 that includes fluorescent material 22. The type of fluorescent material utilized to form the layer 20 can vary, depending upon the desired spectral distribution of the secondary light that will be generated by the fluorescent material 22.

The GaN die 12 and the fluorescent layer 20 are encapsulated by a lens 24. The lens 24 is usually made of a transparent epoxy.

In operation, electrical power is supplied to the GaN die 12 to activate the GaN die. When activated, the GaN die 12 emits the primary light, i.e., blue light, away from the top surface of the GaN die 12. A portion of the emitted primary light is absorbed by the fluorescent material 22 in the layer 20. The fluorescent material 22 then emits secondary light, i.e., the converted light having a longer peak wavelength, in response to absorption of the primary light. The remaining unabsorbed portion of the emitted primary light is transmitted through the fluorescent layer 38, along with the secondary light. The lens 24 directs the unabsorbed primary light and the secondary light in a general direction indicated by arrow 26 as output light. Thus, the output light is a composite light that is composed of the primary light emitted from the GaN die 12 and the secondary light emitted from the fluorescent layer 20.

The output light may have a spectral distribution such that it appears to be "white" light. The color composite of the output light will vary depending upon the spectral distributions and intensities of the secondary light and the primary light.

PCT Application No. PCT/JP97/02610 by Shimizu et al. describes various phosphor LEDs that generate white output light having a color temperature somewhere between 5,000 to 6,000 degrees Kelvin. The LEDs of Shimizu et al. are schematically identical to the LED 10 of FIG. 1. In one embodiment, the LED of Shimizu et al. utilizes Yttrium Aluminum Garnet (YAG) phosphor to convert some of the primary light into secondary light having a peak wavelength of about 580 nm. The spectral distribution 28 of the output light from the Shimizu et al. LED is shown in FIG. 2. The spectral distribution 28 has two peaks 30 and 32. The peak 30 is predominately caused by the primary light emitted from the GaN die of the Shimizu et al. LED. The peak 32 is predominately caused by the secondary light emitted from the YAG phosphor.

A concern with the Shimizu et al. LED is that the "white" output light has an undesirable color balance for a true color rendition. The output light of the Shimizu et al. LED is adequate for applications in which simple illumination is required. However, for applications in which a high color rendition is desired, the output light is deficient in the red region of the visible light spectrum (647–700 nm range). When used for such applications, the red deficiency in the output light causes illuminated red objects to appear less intense in color than they would under a white light having a well-balanced color characteristic. In particular, when used as a backlight for color liquid crystal displays (LCD), the output light of the Shimizu et al. LED causes red colors to be weakly displayed on the LCD. A separate red light source may have to be used in conjunction with the Shimizu et al. LED to compensate for the red deficiency of the output light generated by the Shimizu et al. LED, adding complexity to the system embodying the Shimizu et al. LED.

What is needed is a phosphor LED that can generate white output light having a well-balanced color characteristic for a true color rendition.

SUMMARY

In accordance with embodiments of the invention, a light emitting device includes a light source that emits first light in response to an electrical signal, and a fluorescent layer positioned over the light source. The fluorescent layer includes a first fluorescent material which radiates second light and a second fluorescent material which radiates third light. In one embodiment, the second fluorescent material contains europium activated calcium sulfide. In another embodiment, the second fluorescent material contains europium activated nitrido-silicate. In some embodiments, the device includes a light propagation medium which transmits the first, second, and third light as composite output.

DETAILED DESCRIPTION

Figure 1:
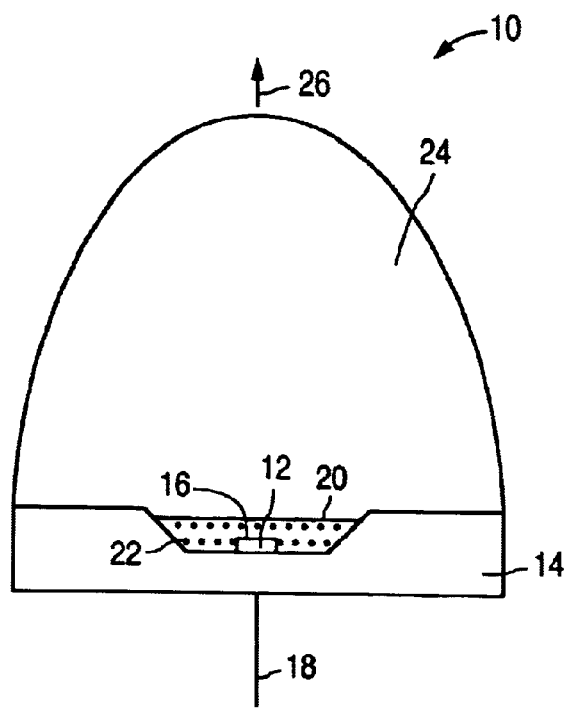
FIG. 1 is a diagram of a generic prior art phosphor light emitting diode (LED).

A light emitting device and a method of fabricating the device utilize a supplementary fluorescent material that radiates light in the red spectral region of the visible light spectrum to increase the red color component of the composite output light. The secondary light from the supplementary fluorescent material allows the device to produce "white" output light that is well-balanced for true color rendering applications. As an example, the device can be used as backlight for a color LCD or a light source for a color scanner.

The light emitting device is an LED that includes a die that emits primary light in response to an electrical signal. Preferably, the die is a Gallium Nitride (GaN) based die that emits blue light having a peak wavelength of 470 nm. The die is encapsulated by an optional transparent layer. The optional transparent layer provides a generally uniform surface for the next layer. Preferably, the optional transparent layer is made of clear resin. The next layer is a fluorescent layer that contains the supplementary fluorescent material. The fluorescent layer also includes the main fluorescent material that radiates broadband secondary light having a first peak wavelength in the yellow region of the visible light spectrum. Coupled to the fluorescent layer is a lens that operates to direct the lights from the die and the fluorescent layer in a direction generally normal to the upper surface of the die.

In operation, the GaN die is activated by electrical power that is supplied to the die via leads. When activated, the GaN die emits the primary light, i.e., blue light, away from the upper surface of the die. The emitted primary light propagates through the optional transparent layer to the fluorescent layer. A portion of the primary light impinges upon the main fluorescent material in the fluorescent layer. The main fluorescent material absorbs the impinging primary light and emits the secondary light having the first peak wavelength. Another portion of the primary light impinges upon the supplementary fluorescent material in the fluorescent layer. The supplementary fluorescent material absorbs the impinging primary light and emits the second light having the second peak wavelength in the red spectral region of the visible light spectrum. However, some of the primary light will not be absorbed by either the main fluorescent material or the supplementary fluorescent material. The amount of primary light that will be unabsorbed by the fluorescent layer is a function of a number of variables. These variables include the thickness of the fluorescent layer and the density of fluorescent material in the layer.

The unabsorbed primary light and the two secondary lights propagate through the lens of the LED. The lens generally directs the propagating lights toward the direction normal to the upper surface of the die. The propagating lights emanate from the lens as the white output light. The color composite of the white output light depends on the intensities and spectral distributions of the emanating light emissions.

In a first embodiment, the main fluorescent material is Cerium (Ce) activated and Gadolinium (Gd) doped Yttrium Aluminum Garnet (YAG) phosphor ("Ce:YAG phosphor"), while the supplementary fluorescent material is chemically-altered Ce:YAG phosphor. The chemically-altered Ce:YAG phosphor is a compound that is produced by doping the Ce:YAG phosphor with the trivalent ion of Praseodymium (Pr).

In a second embodiment, the main fluorescent material is also the Ce:YAG phosphor. However, the supplementary fluorescent material is Europium (Eu) activated Strontium Sulphide (SrS) phosphor ("Eu:SrS"). Preferably, the amount of Eu:SrS phosphor is approximately equal to or less than 10% of the total phosphor weight in the fluorescent layer. The amount of Eu:SrS phosphor in the fluorescent layer can vary, depending on the amount of red color that may be required in the white output light. The exact amount of Eu:SrS phosphor is not critical to the invention.

The method of fabricating the device in accordance with the present invention includes a step in which a light source is provided that emits primary light having a first peak wavelength. Preferably, the light source is a GaN die that emits the primary light having a peak wavelength of approximately 470 nm. Next, a first layer of transparent resin is deposited over the light source, forming an encapsulation layer. In another step, a phosphor-resin mixture is prepared. The phosphor-resin mixture includes two fluorescent materials that are combined with a resin paste. The first fluorescent material has a property of emitting secondary light having a peak wavelength at the yellow region of the visible light spectrum in response to the primary light. Preferably, the secondary light emitted by the first fluorescent material has a broadband spectral distribution. The second fluorescent material has a property of emitting secondary light having a peak wavelength in the red region of the visible light spectrum.

In a first method, the phosphor-resin mixture is prepared by mixing the first fluorescent material of Ce:YAG phosphor with the second fluorescent material of Eu:SrS phosphor. In this embodiment, the phosphor-resin mixture may include, approximately by weight, 74% resin, 18% Ce:YAG phosphor and 8% Eu:SrS phosphor. The amount of a particular phosphor in the phosphor-resin mixture can vary depending on the desired color composite of the white output light that will be generated by the LED.

In a second method, the phosphor-resin mixture is prepared by initially doping the Ce:YAG phosphor with a trivalent ion of the element Pr, yielding a phosphor Pr, Ce:YAG. The portion of the Ce:YAG phosphor that has been unaffected by the doping process constitutes the first fluorescent material in the phosphor-resin mixture. The portion of the Ce:YAG phosphor that has been altered by the doping process constitutes the second fluorescent material. Similar to the previous embodiment, the amount of a particular phosphor in the phosphor-resin mixture can vary depending on the desired color composite of the white output light.

Next, the phosphor-resin mixture is deposited over the encapsulation layer to form a fluorescent layer that uniformly covers the encapsulation layer. The deposited phosphor-resin mixture may then be gelled, i.e., partially cured. A second layer of transparent resin is deposited over the fluorescent layer to form a lens of the LED. Next, the second layer of resin and the fluorescent layer are collectively and completely cured in a single process. The collective curing of the layers ensures the intimate bonding of the fluorescent layer to the lens.

An advantage of the present invention is that the light generating device can provide a composite white output light that is well-balanced with respect to color. In particular, the composite white output light has a greater amount of red color than conventional phosphor LEDs. This characteristic makes the device ideal for applications in which a true color rendition is required without the need to incorporate a supplemental red light source to compensate for any red color deficiency.

Figure 3:
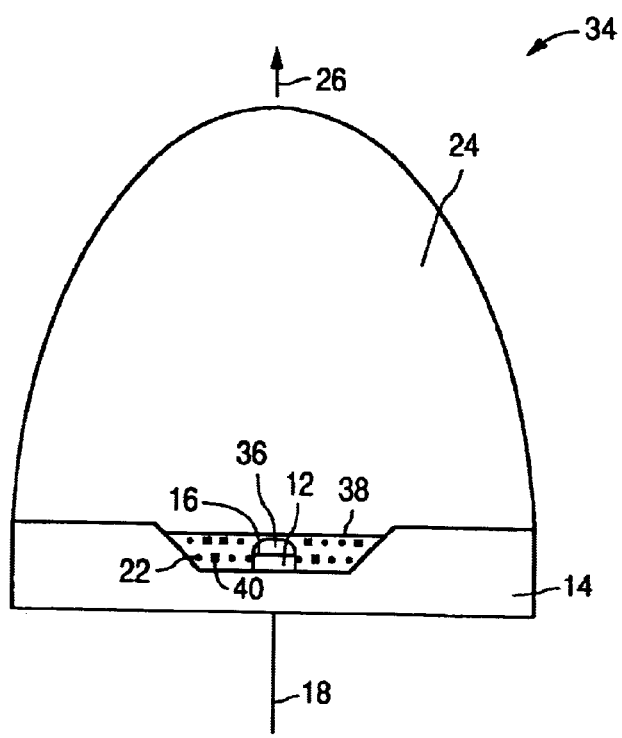
FIG. 3 is a diagram of a red-deficiency-compensating phosphor LED in accordance with the present invention.

With reference to FIG. 3, a red-deficiency-compensating phosphor light emitting diode (LED) 34 in accordance with the present invention is shown. When applicable, the same reference numerals of FIG. 1 will be used for corresponding components illustrated in FIG. 3. The LED 34 is designed to produce "white" output light that is well-balanced with respect to color to provide illumination for a true color rendition. The LED 34 includes III-nitride die based on Gallium Nitride (GaN) 12 that is positioned on the reflector cup lead frame 14 and is electrically coupled to the leads 16 and 18. The leads 16 and 18 provide excitation power to the GaN die 12. The GaN die 12 may generally be in a shape of a square. In one embodiment, the GaN die 12 is configured to emit primary light having a peak wavelength of 470 nm, which lies within the blue region of the light spectrum, i.e., blue light. The GaN die 12 is covered by a spacing layer 36 made of a transparent material. The transparent material may be clear epoxy or glass.

Adjacent to the spacing layer 36 is a fluorescent layer 38. The fluorescent layer 38 includes the fluorescent material 22 and a second fluorescent material 40. The fluorescent material 22 has a property to absorb the primary light and emit secondary light having a first peak wavelength, while the fluorescent material 40 has a property to absorb the primary light and emit secondary light having a second peak wavelength. Preferably, the secondary light emitted by the fluorescent material 22 has a broadband spectral distribution centered in the yellow region of the visible spectrum. However, the secondary light emitted by the fluorescent material 40 has a narrow spectral distribution that is intense in the red region of the visible spectrum. Thus, when the primary light and the secondary lights emitted by the fluorescent materials 22 and 40 are combined, white light is created that is rich in red color, in addition to other colors. The peak wavelengths of the secondary lights depend on the composition of the fluorescent materials 22 and 40, in addition to the peak wavelength of the primary light.

The fluorescent layer 38 is encapsulated by the lens 24 that operates to direct an unabsorbed portion of the primary light and the secondary lights in a general direction indicated by the arrow 26. The lens 24 is preferably made of a transparent material, such as clear epoxy. However, other transparent materials, such as glass, may be utilized. The transparent material used to form the lens 24 is not critical to the invention. The secondary lights from the fluorescent materials 22 and 40 in the layer 38 and the unabsorbed portion of the primary light exit the lens 24 as the white output light.

In operation, the GaN die 12 is activated by electrical power that is supplied to the GaN die 12 via the leads 16 and 18. When activated, the GaN die 12 emits the primary light away from the top surface of the GaN die 12. The emitted primary light propagates through the spacing layer 36 to the fluorescent layer 38. A portion of the primary light impinges upon the fluorescent material 22 in the layer 38. The fluorescent material 22 will absorb the impinging primary light and emit the secondary light having the first peak wavelength. Another portion of the primary light will impinge upon the fluorescent material 40 in the layer 38. The fluorescent material 40 will absorb the impinging primary light and emit the second light having the second peak wavelength. However, some of the primary light will not be absorbed by either the fluorescent material 22 or the fluorescent material 40. The unabsorbed portion of the primary light will propagate through the fluorescent layer 38. The secondary lights from the fluorescent materials 22 and 40 in the layer 38 and the unabsorbed primary light from the GaN die 12 are focused by the lens 24 and exit the LED 34 as the white output light, propagating in the general direction of the arrow 26. The combination of the unabsorbed primary light from the GaN die 12 and the secondary lights from the fluorescent material 22 and 40 in the layer 38 yields the white output light that is well-balanced with respect to color.

In a first embodiment, the fluorescent material 22 is Cerium (Ce) activated and Gadolinium (Gd) doped Yttrium Aluminum Garnet (YAG) phosphor ("Ce:YAG phosphor"), and the fluorescent material 40 is altered Ce:YAG phosphor. The altered Ce:YAG phosphor is a nonstoichiometric compound that is produced by doping the Ce:YAG phosphor with a trivalent ion of Praseodymium (Pr). The presence of Pr in the Ce:YAG phosphor has the effect of "taking over" the functions of the Ce3+ by the Pr3+. The result is that the Pr produces secondary emission that is concentrated in the red region of the visible spectrum, instead of a typical broadband secondary emission from Ce:YAG phosphor that is generally centered in the yellow region of the visible spectrum. The amount of Pr doped Ce:YAG phosphor in the fluorescent layer 38 can vary, as well as the amount of Pr in the modified Ce:YAG, depending on the amount of red color that may be required in the white output light for a particular application.

Figure 2:
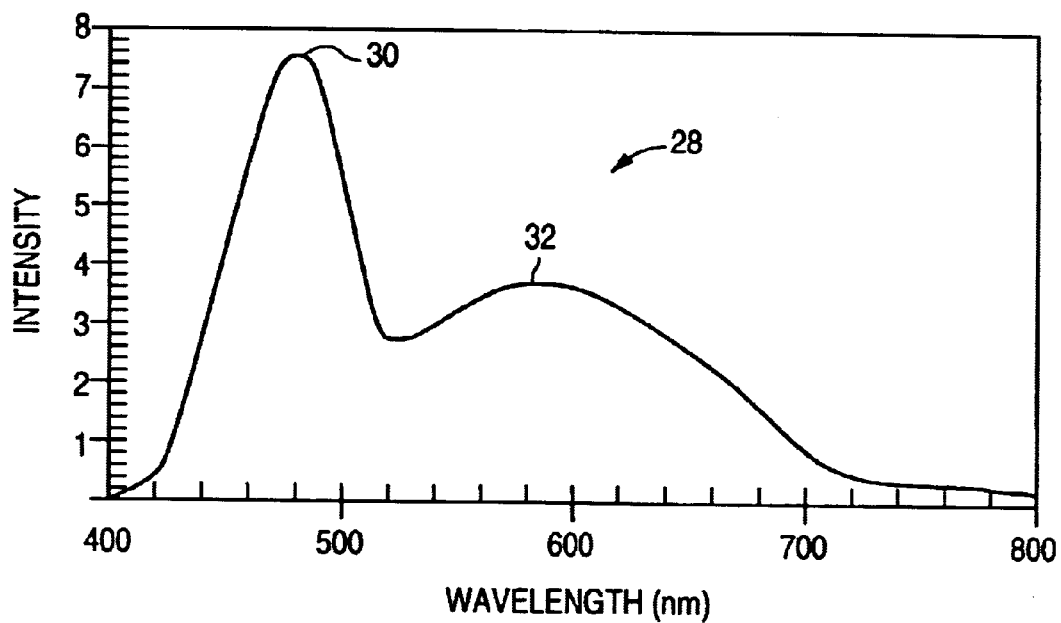
FIG. 2 is a graph showing a spectral distribution of an output light from a specific prior art phosphor LED.
Figure 4:
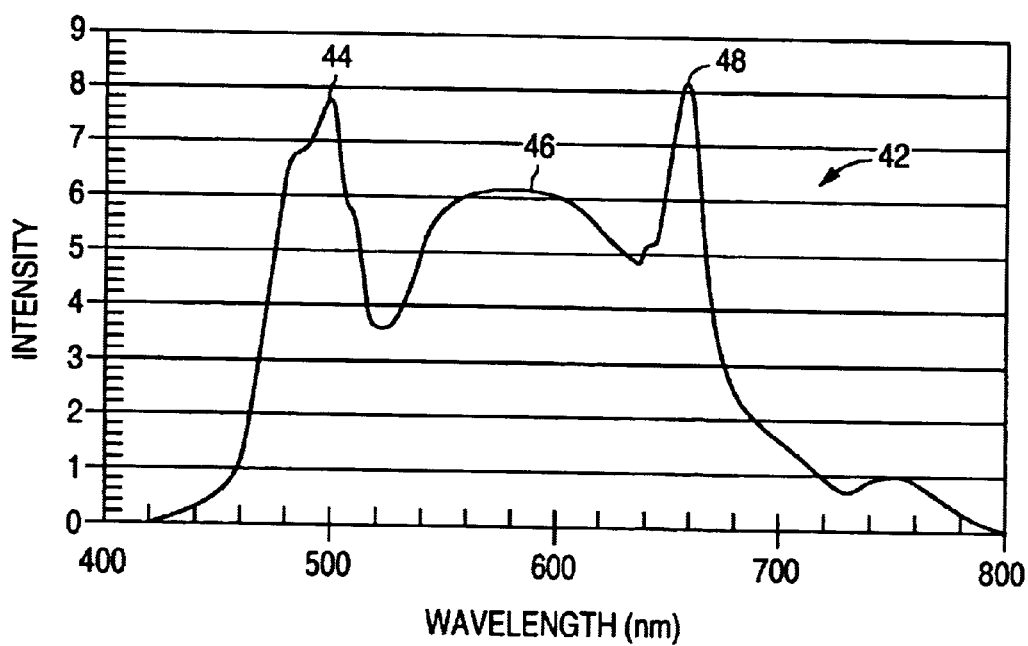
FIG. 4 is a graph showing a spectral distribution of an output light from the phosphor LED of FIG. 3 in accordance with a first embodiment.

In FIG. 4, a spectral distribution 42 of the white output light generated by the LED 34 in accordance with the first embodiment is shown. The spectral distribution 42 includes peaks 44, 46 and 48. The peak 44 is primarily caused by the unabsorbed primary emission component from the LED light. The peak 46 is primarily caused by the secondary emission from the fluorescent material 22, while the peak 48 is primarily caused by the secondary emission from the fluorescent material 40. When compared with the spectral distribution 28 of the white output light generated by the prior art LED of Shimizu et al., (FIG. 2) the apparent difference in the spectral distribution 42 is the extra peak 48 which is in the red region of the visible spectrum. Thus, the white output light generated by the LED 34 has a significant additional amount of red color, as compared to the output light generated by the prior art LED of Shimizu et al. The LED 34 in accordance with the first embodiment may be configured to generate white output light having a color temperature of 3,800 degrees Kelvin and a Color Rendering Index of 85.

In a second embodiment, the fluorescent material 22 is also Ce:YAG phosphor. However, the fluorescent material 40 is Europium (Eu) activated Strontium Sulfide (SrS) phosphor ('Eu:SrS'). Preferably, the amount of Eu:SrS phosphor is equal to or less than 10% of the total phosphor weight in the layer 38. The amount of Eu:SrS phosphor in the layer 38 can vary depending on the amount of red color that may be required in the white output light. The exact amount of Eu:SrS phosphor in the layer 38 is not critical to the invention.

The second embodiment only differs from the first embodiment in that the composition of the fluorescent material 40 varies for the two embodiments. However, the fluorescent material 40 for both embodiment operates to enhance the red color component of the white output light to compensate for any red color deficiency. Since the operation of the two embodiments are virtually identical, the spectral distribution of the output light for the second embodiment is very similar to the spectral distribution 42 of the output light generated by the first embodiment. Thus, the spectral distribution of the white output light generated by the LED 34 in accordance with the second embodiment would also have a peak wavelength in the red region of the visible light spectrum.

Any red emitting phosphor, excitable by either unconverted light from die 12 or by light emitted from fluorescent material 22, is suitable for use as fluorescent material 40. In a third embodiment, fluorescent material 22 is Ce:YAG phosphor or any other suitable yellow-emitting phosphor, and fluorescent material 40 is Europium (Eu) activated Calcium Sulfide (CaS) phosphor ('Eu:CaS'). The amount of Eu:CaS phosphor in the third embodiment may be equal to or less than 25% of the total phosphor weight in the layer 38. The amount of Eu:CaS phosphor in the layer 38 can vary depending on the amount of red color that may be required in the white output light.

In a fourth embodiment, fluorescent material 22 is Ce:YAG phosphor or any other suitable yellow-emitting phosphor, and fluorescent material 40 is a mixed ternary crystalline material of Calcium Sulfide (CaS) and Strontium Sulfide (SrS) activated with Europium (($Ca_xSr_{1-x}$)S:$Eu^{2+}$). The peak emission wavelength of material 40 according to the fourth embodiment shifts towards longer wavelengths with increasing Ca content, ranging from about 619 nm for x=0 to about 656 nm for x=1. As in the second and third embodiments, the amount of ($Ca_xSr_{1-x}$)S:$Eu^{2+}$ phosphor may vary depending on the amount of red color that may be required in the white output light and may be less than 25% of the total phosphor weight in layer 38.

In a fifth embodiment, fluorescent material 22 is Ce:YAG phosphor or any other suitable yellow-emitting phosphor, and fluorescent material 40 is a Nitrido-Silicate doped with Europium. A Nitrido-Silicate fluorescent material 40 may have the chemical formula ($Sr_{1-x-y-z}Ba_xCa_y$)$_2Si_5N_8$:$Eu_z^{2+}$ where $0 \leq x,y \leq 0.5$ and $0 \leq z \leq 0.1$. Nitrido-Silicate compounds exhibit good chemical, thermal, and mechanical stability. The Nitrido-Silicate phosphor may comprise about 22% to about 28% by weight of the total phosphor.

In a sixth embodiment, fluorescent material 40 is a mixture of any of the above-described compounds.

The quality of light produced by a light source may be characterized by a color rendering index, which indicates how truly a light source renders colors. The color rendering index is established by a visual experiment. First the color temperature of a light source to be evaluated is determined. Eight standard color samples are then illuminated first by the light source, then by a light from a blackbody having the same color temperature. If a standard color sample does not change color, then the light source has a theoretically perfect color rendering index value of 100. The color rendering index is usually termed "Ra" and is an average of the color rendering index value of all eight standard color samples.

For the same color temperature, the use of Eu:CaS as fluorescent material 40 yields a device that generates white light having better color rendering than the light generated from a device using Eu:SrS as fluorescent material 40. However, the use of Eu:CaS instead of Eu:SrS has been observed to reduce efficiency of the device. The use of ternary ($Ca_xSr_{1-x}$)S:$Eu^{2+}$ is expected to yield intermediate results of both Ra and efficiency. Accordingly, a phosphor with a higher mole fraction of Ca may be used where high color rendering is required, and a phosphor with a lower mole fraction of Ca may be used where high efficiency is required.

Figure 6:
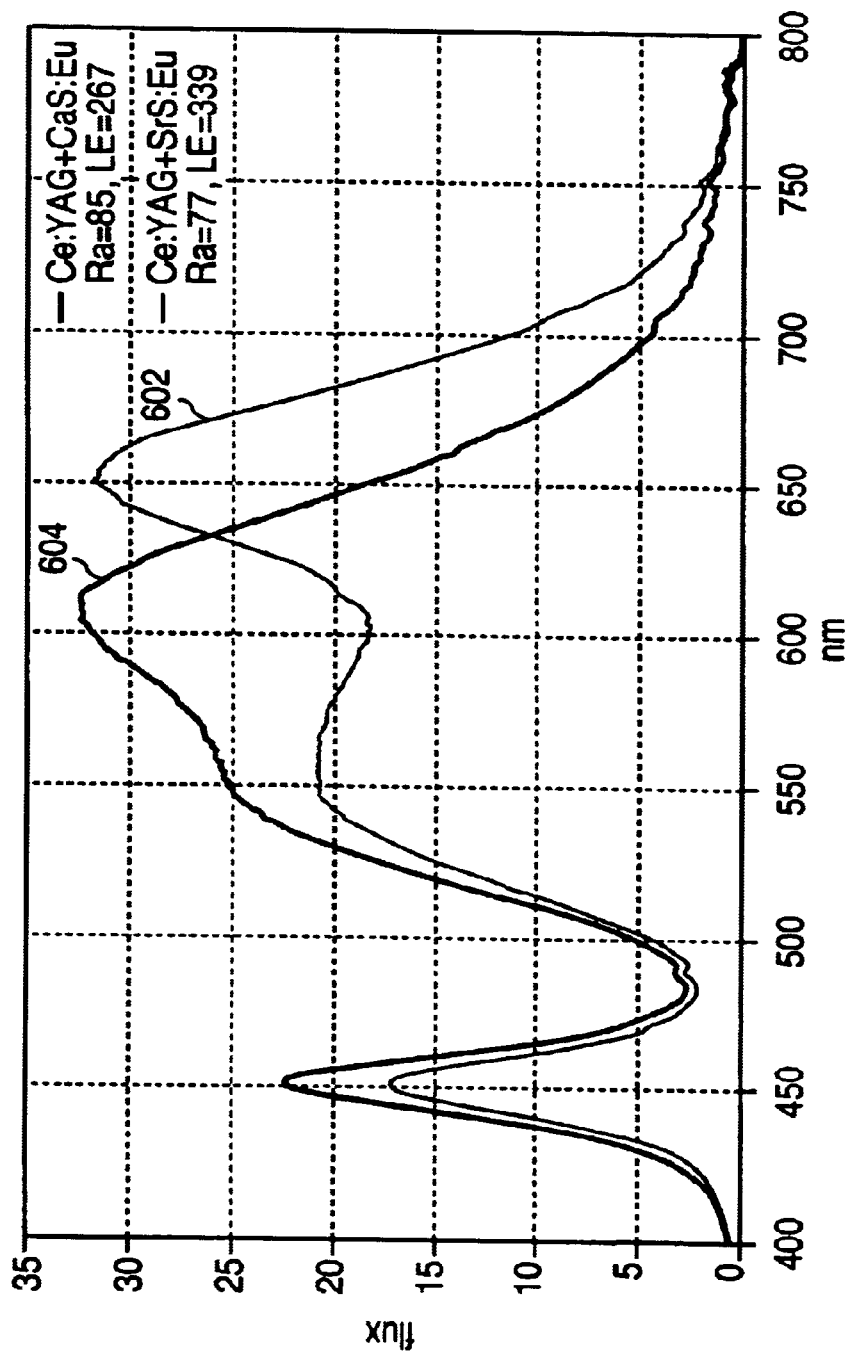
FIG. 6 is a graph showing spectral distributions of output light from phosphor LEDs of FIG. 3 in accordance with two embodiments.

Examples of the output spectra of a Ce:YAG/CaS:Eu device (spectrum 602) and a Ce:YAG/SrS:Eu device (spectrum 604) each with a color temperature of about 3,200 degrees Kelvin are illustrated in FIG. 6. The CaS device has a Ra of 85 and a luminous efficiency of 267. The SrS device has a Ra of 77 and a luminous efficiency of 339. As is clear from FIG. 6, the emission of $Eu^{2+}$ in CaS is red shifted compared to $Eu^{2+}$ in SrS, and the luminous equivalent and consequently the overall efficency of the phosphor-converted LED of any combination of Ce:YAG and CaS:Eu is much lower than a similar device using SrS. However, counter-intuitively the color rendering of the CaS:Eu+Ce:YAG+blue LED spectrum 602 is appreciably higher, Ra=85, than the SrS:Eu+Ce:YAG+blue LED spectrum 604, Ra=77.

Figure 7:
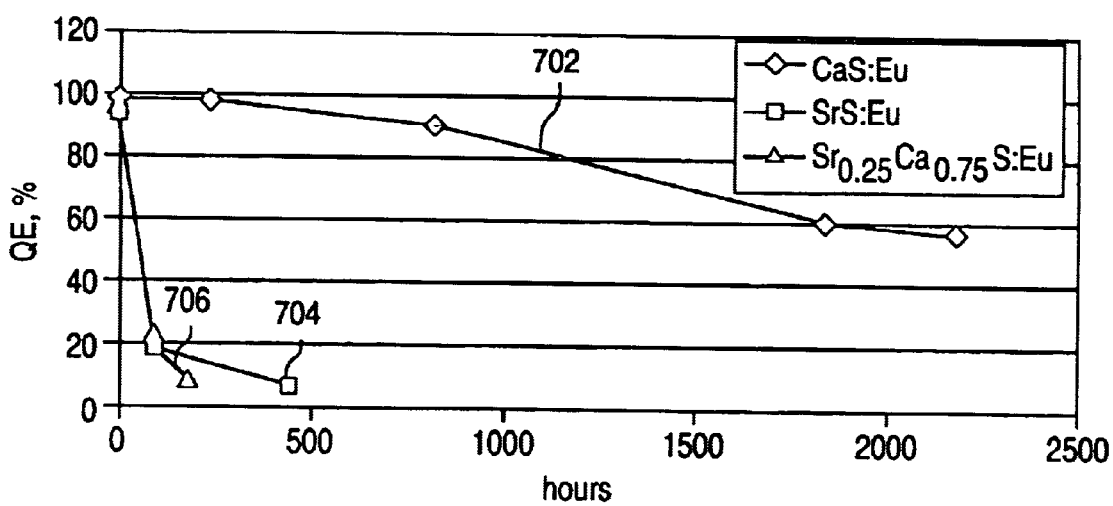
FIG. 7 is a graph showing the quantum efficiency of three embodiments of the invention.

A further advantage of CaS over SrS is its much higher chemical stability and its superior behavior in stress tests at high temperature and high relative humidity, as illustrated in FIG. 7. FIG. 7 illustrates the relative quantum efficiency of three devices measured over time under 85% relative humidity at 85° C. Curve 702 is a device using CaS:Eu as fluorescent material 40, curve 704 is a device using SrS:Eu as fluorescent material 40, and curve 706 is a device using a $Sr_{0.25}Ca_{0.75}$S:Eu as fluorescent material 40. Both devices which included Strontium in fluorescent material 40 demonstrated a remarkably rapid decrease in the relative quantum efficiency. In fact, device 706, in which fluorescent material 40 contained a great deal of Calcium and some Strontium, demonstrated a more rapid decrease in relative quantum efficiency than device 704, in which fluorescent material 40 was entirely SrS. In contrast, device 702, in which fluorescent material 40 contained no Strontium, the decrease in relative quantum efficiency was much slower and much less pronounced. As is clear from FIG. 7, the presence of any Strontium in fluorescent material 40 causes an unexpectedly rapid decrease in relative quantum efficiency in humid conditions, as compared to a device where CaS, without any Strontium, is used as fluorescent material 40.

Figure 8:
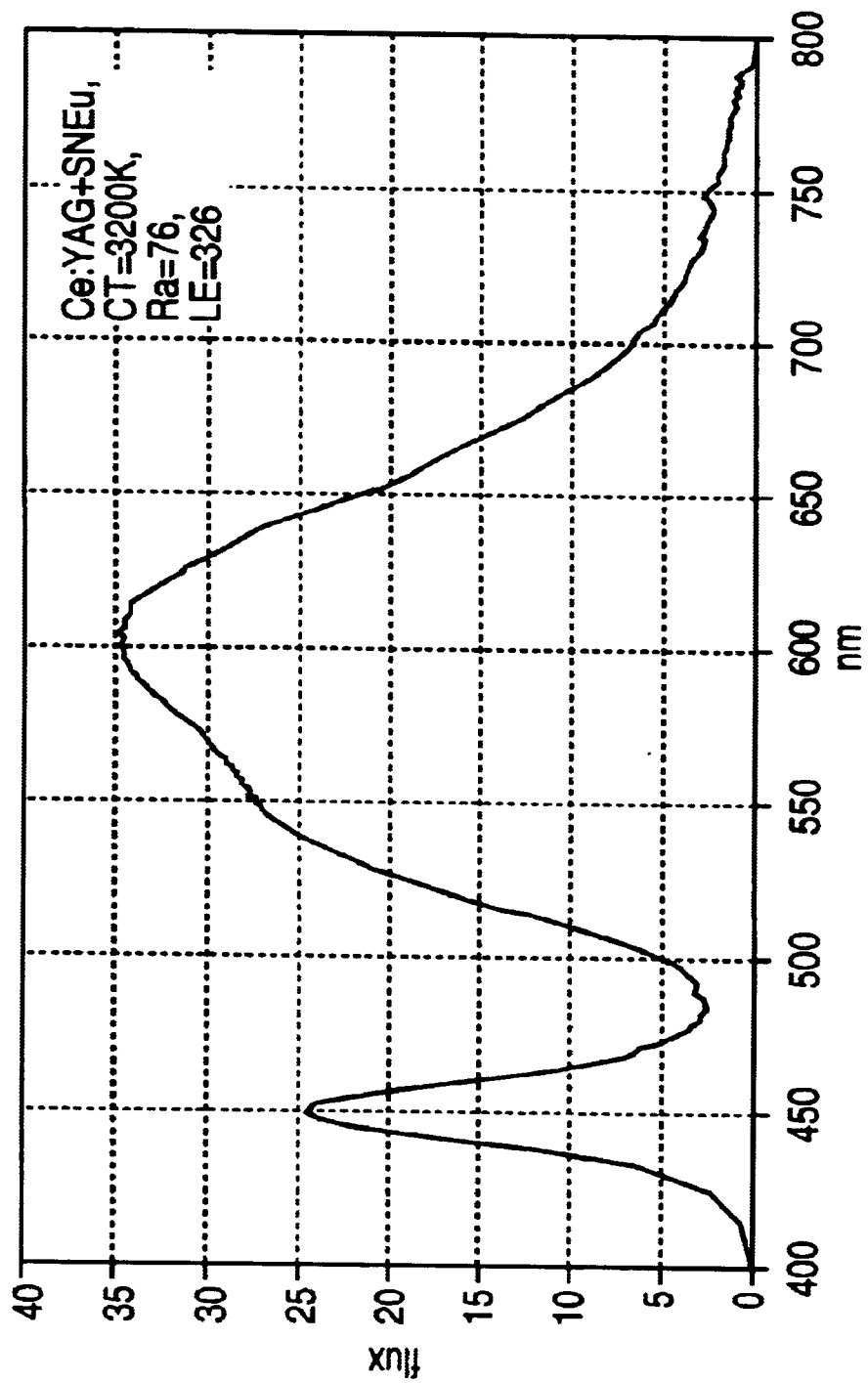
FIG. 8 is a graph showing a spectral distribution of an output light from the phosphor LED of FIG. 3 in accordance with an alternative embodiment.

The color temperature and color rendering index of two devices using Ce:YAG as fluorescent material 22 and a Nitrido-Silicate as fluorescent material 40 are shown below in Table 1. In the devices shown in Table 1, 22% of the total phosphor weight is a Nitrido-Silicate phosphor and 78% of the total phosphor weight is Ce:YAG. A spectrum produced by a device using Ce:YAG as fluorescent material 22 and a Nitrido-Silicate as fluorescent material 40 is illustrated in FIG. 8.

TABLE 1

| Ra | Temperature |
|----|-------------|
| 75 | 4400        |
| 77 | 4650        |

Figure 5:
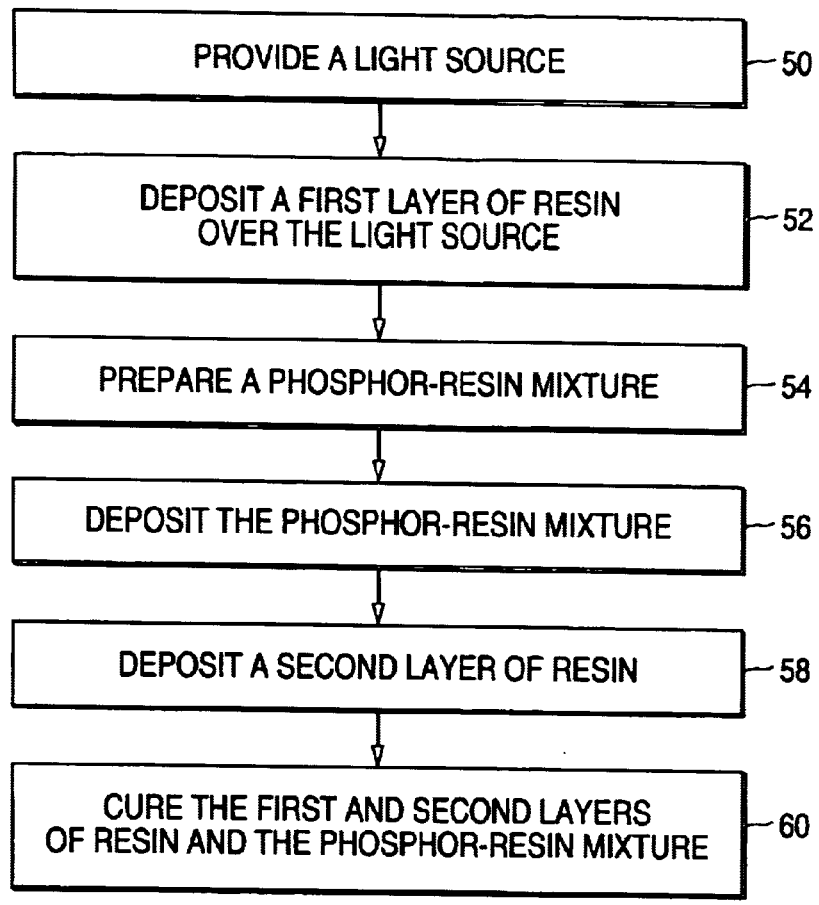
FIG. 5 is a flow diagram of a method of fabricating a phosphor LED in accordance with the present invention.

A method of fabricating a red-deficiency-compensating phosphor LED will be described with reference to a flow diagram in FIG. 5. At step 50, a light source is provided that emits primary light having a first peak wavelength. Preferably, the light source is a III-nitride die that emits the primary light having a peak wavelength of approximately 455 nm. Next, at step 52, a first layer of transparent material such as resin is deposited over the light source, forming an encapsulation layer. Step 52 is not critical to the invention and may be omitted from the method. At step 54, a phosphor-dispersing material mixture is prepared to form a fluorescent layer in the LED. Though the description below describes an embodiment where the dispersing material is resin, the dispersing material may be any suitable material including, for example, resin, polymers, and glasses. In embodiments where the dispersing material is a resin, the phosphor-resin mixture includes two fluorescent materials that are combined in a resin paste. The first fluorescent material has a property of emitting secondary light having a peak wavelength in the yellow region of the visible light spectrum in response to the primary light. Preferably, the secondary light emitted by the first fluorescent material has a broadband spectral distribution. The second fluorescent material has a property of emitting secondary light having a peak wavelength in the red region of the visible light spectrum.

In a first method, the phosphor-dispersant mixture is prepared by mixing the first fluorescent material of Ce:YAG phosphor with the second fluorescent material of Eu:SrS, Eu:CaS, $(Ca_xSr_{1-x})S:Eu^{2+}$, or $(Sr_{1-x-y-z}Ba_xCa_y)_2Si_5N_8:Eu_z^{2+}$ phosphor. In one embodiment, the phosphor-dispersant mixture may include, approximately by weight, 74% dispersant, 18% Ce:YAG phosphor and 8% Eu:SrS phosphor. In another embodiment, the phosphor-dispersant mixture may include, approximately by weight, 39% to 93% dispersing material, 6% to 28% Ce:YAG, and 3% to 33% Eu:CaS. In a specific example, the phosphor-dispersant mixture includes, 82.8% dispersant, 13% Ce:YAG phosphor, and 4.2% Eu:CaS phosphor. If $(Ca_xSr_{1-x})S:Eu^{2+}$ phosphor is used as the second fluorescent material, the amount of Ce:YAG may be between about 13% and about 18% and the amount of $(Ca_xSr_{1-x})S:Eu^{2+}$ may be between about 4.2% and about 8%. In another embodiment, the phosphor-dispersant mixture may include, approximately by weight, 38% to 92% dispersing material, 5% to 25% Ce: YAG, and 3% to 24% Nitrido-Silicate. In a specific example, the phosphor-dispersant mixture includes 7% to 17% Ce:YAG and 6% to 11% $(Sr_{1-x-y-z}Ba_xCa_y)_2Si_5N_8:Eu_z^{2+}$.

The amount of a particular phosphor in the phosphor-resin mixture can vary, depending on the desired color composite of the white output light that will be generated by the LED. For example, the red color component of the white output light can be increased by adding more Eu:SrS, Eu:CaS, $(Ca_xSr_{1-x})S:Eu^{2+}$, or $(Sr_{1-x-y-z}Ba_xCa_y)_2Si_5N_8:Eu_z^{2+}$ phosphor in the phosphor-resin mixture. It has been observed that CaS and $(Sr_{1-x-y-z}Ba_xCa_y)_2Si_5N_8:Eu_z^{2+}$ have a higher stability than SrS. As a result, layer 38 may be easier to cure when CaS or $(Sr_{1-x-y-z}Ba_xCa_y)_2Si_5N_8:Eu_z^{2+}$, rather than SrS, is used as fluorescent material 40.

In a second method, the phosphor-resin mixture is prepared by initially doping the Ce:YAG phosphor with the trivalent ion of the element Pr. The portion of the Ce:YAG phosphor that has been unaffected by the doping process constitutes the first fluorescent material in the phosphor-resin mixture. The portion of the Ce:YAG phosphor that has been altered by the doping process constitutes the second fluorescent material. Similar to the previous embodiment, the amount of a particular phosphor in the phosphor-resin mixture can vary, depending on the desired color composite of the white output light.

Next, at step 56, the phosphor-resin mixture is deposited over the encapsulation layer to form a fluorescent layer that uniformly covers the encapsulation layer. The deposited phosphor-resin mixture may then be gelled, i.e., partially cured. At step 58, a second layer of transparent resin is deposited over the fluorescent layer to form a lens of the LED. The second layer of resin and the fluorescent layer are then collectively and completely cured in a single process, at step 60. The collective curing of the layers ensures the intimate bonding of the fluorescent layer to the lens.

In another embodiment, the fluorescent layer is deposited by electrophoretic deposition. Electrophoretic deposition of phosphors is described in more detail in U.S. application Ser. No. 09/879,627, titled "Using Electrophoresis To Produce A Conformally Coated Phosphor-Converted Light Emitting Semiconductor Structure", filed Jun. 11, 2001, and incorporated herein by this reference.

The above-described embodiments of the present invention are merely meant to be illustrative and not limiting. For example, the invention is not limited to III-nitride devices, and may be applied to devices made from other materials systems. It will thus be obvious to those skilled in the art that various changes and modifications may be made without departing from this invention in its broader aspects. Therefore, the appended claims encompass all such changes and modifications as falling within the true spirit and scope of this invention.

What is being claimed is:

1. A light emitting device comprising:
    a light source that emits first light in a first spectral range, in response to an applied electrical signal; and
    a fluorescent layer positioned over the light source to receive at least a portion of the first light emitted from the light source, the fluorescent layer comprising:
        a first fluorescent material having a property of radiating second light in a second spectral range in response to the first light;
        a second fluorescent material having a property of radiating third light in a third spectral range, the second fluorescent material comprising a nitrido-silicate.

2. The light emitting device of claim 1 further comprising:
    a light propagation medium optically coupled to said fluorescent layer to transmit the first light, second light, and third light as composite output in a direction away from the light source, the composite output light having a color characteristic at least partially determined by intensities of the first light, second light, and third light.

3. The light emitting device of claim 2 wherein the composite output light has a color rendering index greater than 75.

4. The light emitting device of claim 1 wherein the second fluorescent material radiates the third light in response to the first light.

5. The light emitting device of claim 1 wherein the second fluorescent material radiates the third light in response to the second light.

6. The light emitting device of claim 1 wherein the second fluorescent material comprises $(Sr_{1-x-y-z}Ba_xCa_y)_2Si_5N_8:Eu_z^{2+}$ where $0 \leq x,y \leq 0.5$ and $0 \leq z \leq 0.1$.

7. The light emitting device of claim 1 wherein the first fluorescent material comprises Yttrium Aluminum Garnet (YAG).

8. The light emitting device of claim 1 wherein the light source comprises a III-nitride light emitting diode.

9. The light emitting device of claim 1 wherein:
the first fluorescent material is cerium activated yttrium aluminum garnet; and
the first fluorescent material comprises between 5 and 25 weight percent of the fluorescent layer.

10. The light emitting device of claim 1 wherein:
the second fluorescent material is europium activated nitrido silicate; and
the second fluorescent material comprises between 3 and 24 weight percent of the fluorescent layer.

11. The light emitting device of claim 1 wherein:
the fluorescent layer further comprises dispersing material, and
the dispersing material comprises between 92 and 38 weight percent of the fluorescent layer.

12. The light emitting device of claim 1 wherein the light source is a die and the die is encapsulated in a layer of transparent material.

13. The light emitting device of claim 1 wherein the second fluorescent material comprises europium activated nitrido-silicate.

14. A light emitting device comprising:
a light source that emits first light in a first spectral region, in response to an applied electrical signal; and
a fluorescent layer positioned over the light source to receive at least a portion of the first light emitting from the light source, the fluorescent layer comprising:
a first fluorescent material having a property of radiating second light in a second spectral range in response to the first light;
a second fluorescent material having a property of radiating third light in a third spectral range, the second fluorescent material comprising CaS and having a peak emission wavelength greater than 650 nm.

15. The light emitting device of claim 14 further comprising:
a light propagation medium optically coupled to said fluorescent layer to transmit the first light, second light, and third light as composite output in a direction away from the light source, the composite output light having a color characteristic at least partially determined by intensities of the first light, second light, and third light.

16. The light emitting device of claim 15 wherein the composite output light has a color rendering index greater than 80.

17. The light emitting device of claim 14 wherein the second fluorescent material is europium activated CaS.

18. The light emitting device of claim 14 wherein the fluorescent layer further comprises dispersing material, and
the dispersing material comprises between about 93 and about 39 weight percent of the fluorescent layer.

19. The light emitting device of claim 14 wherein:
the first fluorescent material is cerium activated yttrium aluminum garnet; and
the first fluorescent material comprises between about 6 and about 28 weight percent of the fluorescent layer.

20. The light emitting device of claim 14 wherein:
the second fluorescent material is europium activated CaS; and
the second fluorescent material comprises between about 3 and about 33 weight percent of the fluorescent layer.

21. The light emitting device of claim 14 wherein the second spectral range is yellow.

22. The light emitting device of claim 14 wherein the third spectral range is red.

23. The light emitting device of claim 14 wherein the second fluorescent material has a peak emission wavelength of about 656 nm.

24. The light emitting device of claim 14 wherein the second light has a peak emission wavelength in the second spectral range and the second spectral range is between about 560 nm and about 600 nm.

25. The light emitting device of claim 14 wherein the third light has a peak emission wavelength in the third spectral range and the third spectral range is between about 647 nm and about 700 nm.

* * * * *

(12) EX PARTE REEXAMINATION CERTIFICATE (10679th)
United States Patent
Mueller-Mach et al.

(10) Number: US 6,680,569 C1
(45) Certificate Issued: *Aug. 12, 2015

(54) RED-DEFICIENCY COMPENSATING PHOSPHOR LIGHT EMITTING DEVICE

(75) Inventors: Regina B. Mueller-Mach, San Jose, CA (US); Gerd O. Mueller, San Jose, CA (US); Tomas Jüestel, Aachen (DE); Peter Schmidt, Aachen (DE)

(73) Assignee: PHILIPS LUMILEDS LIGHTING COMPANY LLC, San Jose, CA (US)

Reexamination Request:
No. 90/013,344, Sep. 15, 2014

Reexamination Certificate for:
Patent No.: 6,680,569
Issued: Jan. 20, 2004
Appl. No.: 10/083,314
Filed: Feb. 25, 2002

( * ) Notice: This patent is subject to a terminal disclaimer.

Related U.S. Application Data

(63) Continuation-in-part of application No. 09/252,207, filed on Feb. 18, 1999, now Pat. No. 6,351,069.

(51) Int. Cl.
*H01L 33/00* (2010.01)
*H01L 33/50* (2010.01)

(52) U.S. Cl.
CPC ............. *H01L 33/504* (2013.01); *H01L 33/502* (2013.01)

(58) Field of Classification Search
None
See application file for complete search history.

(56) References Cited

To view the complete listing of prior art documents cited during the proceeding for Reexamination Control Number 90/013,344, please refer to the USPTO's public Patent Application Information Retrieval (PAIR) system under the Display References tab.

*Primary Examiner* — James Menefee

(57) ABSTRACT

A light emitting device includes a light source that emits first light in response to an electrical signal, and a fluorescent layer positioned over the light source. The fluorescent layer includes a first fluorescent material which radiates second light and a second fluorescent material which radiates third light. In one embodiment, the second fluorescent material contains europium activated calcium sulfide. In another embodiment, the second fluorescent material contains europium activated nitrido-silicate. In some embodiments, the device includes a light propagation medium which transmits the first, second, and third light as composite output.

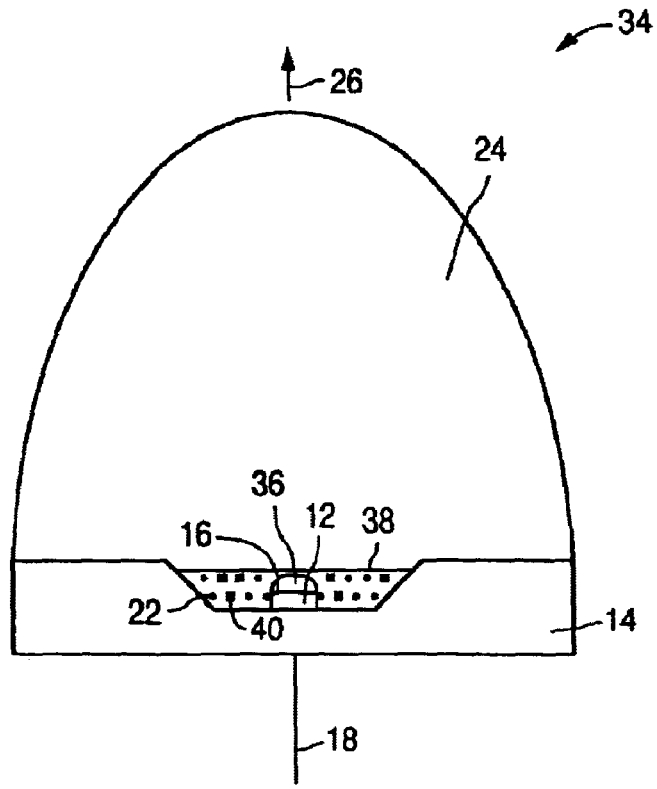

US 6,680,569 C1

EX PARTE
REEXAMINATION CERTIFICATE

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 9, 10 and 12 are determined to be patentable as amended.

Claims 2-8, 11 and 13, dependent on an amended claim, are determined to be patentable.

New claims 26-78 are added and determined to be patentable.

Claims 14-25 were not reexamined.

1. A light emitting device comprising:
a light source that emits first light in a first spectral range, in response to an applied electrical signal; and
a fluorescent layer positioned over the light source to receive at least a portion of the first light emitted from the light source, the fluorescent layer comprising:
a first fluorescent material having a property of radiating second light in a second spectral range in response to the first light;
a second fluorescent material having a property of radiating third light in a third spectral range, the second fluorescent material comprising a nitrido-silicate[.], *wherein a transparent material separates the light source from the fluorescent layer.*

9. [The light emitting device of claim 1 wherein:] *A light emitting device comprising:*
*a light source that emits first light in a first spectral range, in response to an applied electrical signal; and*
*a fluorescent layer positioned over the light source to receive at least a portion of the first light emitted from the light source, the fluorescent layer comprising:*
*a first fluorescent material having a property of radiating second light in a second spectral range in response to the first light;*
*a second fluorescent material having a property of radiating third light in a third spectral range, the second fluorescent material comprising a nitrido-silicate,*
*wherein* the first fluorescent material is cerium activated yttrium aluminum garnet; and
the first fluorescent material comprises between 5 and 25 weight percent of the fluorescent layer.

10. [The light emitting device of claim 1 wherein:] *A light emitting device comprising:*
*a light source that emits first light in a first spectral range, in response to an applied electrical signal; and*
*a fluorescent layer positioned over the light source to receive at least a portion of the first light emitted from the light source, the fluorescent layer comprising:*
*a first fluorescent material having a property of radiating second light in a second spectral range in response to the first light;*
*a second fluorescent material having a property of radiating third light in a third spectral range, the second fluorescent material comprising a nitrido-silicate,*
*wherein* the second fluorescent material is europium activated nitrido silicate; and
the second fluorescent material comprises between 3 and 24 weight percent of the fluorescent layer.

12. [The light emitting device of claim 1] *A light emitting device comprising:*
*a light source that emits first light in a first spectral range, in response to an applied electrical signal; and*
*a fluorescent layer positioned over the light source to receive at least a portion of the first light emitted from the light source, the fluorescent layer comprising:*
*a first fluorescent material having a property of radiating second light in a second spectral range in response to the first light;*
*a second fluorescent material having a property of radiating third light in a third spectral range, the second fluorescent material comprising a nitrido-silicate,*
wherein the light source is a die and the die is encapsulated in a layer of transparent material.

26. *A light emitting device comprising:*
*a light source that emits first light in a first spectral range, in response to an applied electrical signal; and*
*a fluorescent layer positioned over the light source to receive at least a portion of the first light emitted from the light source, the fluorescent layer comprising:*
*a first fluorescent material having a property of radiating second light in a second spectral range in response to the first light;*
*a second fluorescent material having a property of radiating third light in a third spectral range, the second fluorescent material comprising a nitrido-silicate,*
*wherein the second fluorescent material comprises $Sr_{1-x-y-z}Ba_xCa_y)_2Si_5N_8:Eu_z^{2+}$, where $0<x\leq0.5$, $0\leq y\leq 0.5$, $0<1-x-y-z$, and $0\leq z\leq 0.1$.*

27. *The light emitting device of claim 26 further comprising:*
*a light propagation medium optically coupled to said fluorescent layer to transmit the first light, second light, and third light as composite output light in a direction away from the light source, the composite output light having a color characteristic at least partially determined by intensities of the first light, second light, and third light.*

28. *The light emitting device of claim 27 wherein the composite output light has a color rendering index greater than 75.*

29. *The light emitting device of claim 27 wherein the composite output light has a luminous efficiency greater than 320 lumens per watt.*

30. *The light emitting device of claim 26 wherein the second fluorescent material radiates the third light in response to the first light.*

31. *The light emitting device of claim 26 wherein the second fluorescent material radiates the third light in response to the second light.*

32. *The light emitting device of claim 26 wherein the first fluorescent material comprises Yttrium Aluminum Garnet (YAG).*

33. *The light emitting device of claim 26 wherein the light source comprises a III-nitride light emitting diode.*

34. *The light emitting device of claim 26 wherein:*
*the first fluorescent material is cerium activated yttrium aluminum garnet; and*
*the first fluorescent material comprises between 5 and 25 weight percent of the fluorescent layer.*

35. *The light emitting device of claim 26 wherein:*
*the second fluorescent material comprises between 3 and 24 weight percent of the fluorescent layer.*

36. The light emitting device of claim 26 wherein:
the fluorescent layer further comprises dispersing material, and the dispersing material comprises between 38 and 92 weight percent of the fluorescent layer.

37. The light emitting device of claim 26 wherein a transparent material separates the light source from the fluorescent layer.

38. A light emitting device comprising:
a light source that emits first light in a first spectral range, in response to an applied electrical signal; and
a fluorescent layer positioned over the light source to receive at least a portion of the first light emitted from the light source, the fluorescent layer comprising:
a first fluorescent material having a property of radiating second light in a second spectral range in response to the first light;
a second fluorescent material having a property of radiating third light in a third spectral range,
wherein the first fluorescent material comprises cerium-activated yttrium aluminum garnet;
the second fluorescent material comprises europium-activated nitrido-silicate; and
the first and second fluorescent materials together comprise at least 15 weight percent of the fluorescent layer.

39. The light emitting device of claim 38 wherein the first fluorescent material comprises between 5 and 25 weight percent of the fluorescent layer.

40. The light emitting device of claim 38 wherein the second fluorescent material comprises between 3 and 24 weight percent of the fluorescent layer.

41. The light emitting device of claim 40 further comprising:
a light propagation medium optically coupled to said fluorescent layer to transmit the first light, second light, and third light as composite output light in a direction away from the light source, the composite output light having a color characteristic at least partially determined by intensities of the first light, second light, and third light.

42. The light emitting device of claim 41 wherein the composite output light has a color rendering index greater than 75.

43. The light emitting device of claim 41 wherein the composite output light has a luminous efficiency greater than 320 lumens per watt.

44. The light emitting device of claim 38 wherein the second fluorescent material radiates the third light in response to the first light.

45. The light emitting device of claim 38 wherein the second fluorescent material radiates the third light in response to the second light.

46. The light emitting device of claim 38 wherein the second fluorescent material comprises $(Sr_{1-x-y-z}Ba_xCa_y)_2Si_5N_8$:$Eu_z^{2+}$ where $0 \le x$, $y \le 0.5$ and $0 \le z \le 0.1$.

47. The light emitting device of claim 38 wherein the light source comprises a III-nitride light emitting diode.

48. The light emitting device of claim 38 wherein:
the fluorescent layer further comprises dispersing material, and the dispersing material comprises between 38 and 85 weight percent of the fluorescent layer.

49. The light emitting device of claim 38 wherein a transparent material separates the light source from the fluorescent layer.

50. A light emitting device comprising:
a light source that emits first light in a first spectral range, in response to an applied electrical signal; and
a fluorescent layer positioned over the light source to receive at least a portion of the first light emitted from the light source, the fluorescent layer comprising:
a first fluorescent material having a property of radiating second light in a second spectral range in response to the first light, the first fluorescent material comprising cerium-activated yttrium aluminum garnet and comprising between 72 and 78 weight percent of the first and second fluorescent materials in the fluorescent layer;
a second fluorescent material having a property of radiating third light in a third spectral range, the second fluorescent material comprising europium-activated nitrido-silicate and comprising between 22 and 28 weight percent of the first and second fluorescent materials in the fluorescent layer.

51. The light emitting device of claim 50 further comprising:
a light propagation medium optically coupled to said fluorescent layer to transmit the first light, second light, and third light as composite output in a direction away from the light source, the composite output light having a color characteristic at least partially determined by intensities of the first light, second light, and third light.

52. The light emitting device of claim 51 wherein the composite output light has a color rendering index greater than 75.

53. The light emitting device of claim 51 wherein the composite output light has a luminous efficiency greater than 320 lumens per watt.

54. The light emitting device of claim 50 wherein the second fluorescent material radiates the third light in response to the first light.

55. The light emitting device of claim 50 wherein the second fluorescent material radiates the third light in response to the second light.

56. The light emitting device of claim 50 wherein the second fluorescent material comprises $(Sr_{1-x-y-z}Ba_xCa_y)_2Si_5N_8$:$Eu_z^{2+}$ where $0 \le x$, $y \le 0.5$ and $0 \le z \le 0.1$.

57. The light emitting device of claim 50 wherein the light source comprises a III-nitride light emitting diode.

58. The light emitting device of claim 50 wherein the first fluorescent material comprises between 5 and 25 weight percent of the fluorescent layer.

59. The light emitting device of claim 50 wherein the second fluorescent material comprises between 3 and 24 weight percent of the fluorescent layer.

60. The light emitting device of claim 50 wherein:
the fluorescent layer further comprises dispersing material, and the dispersing material comprises between 38 and 92 weight percent of the fluorescent layer.

61. The light emitting device of claim 50 wherein a transparent material separates the light source from the fluorescent layer.

62. A light emitting device comprising:
a light source that emits first light in a first spectral range, in response to an applied electrical signal; and
a fluorescent layer positioned over the light source to receive at least a portion of the first light emitted from the light source, the fluorescent layer comprising:
a first fluorescent material having a property of radiating second light in a second spectral range in response to the first light; and
a second fluorescent material having a property of radiating third light in a third spectral range, the second fluorescent material comprising a nitrido-silicate;

wherein the light in the first, second, and third spectral ranges together generate a composite light emission spectrum that exhibits a first visually distinct spectral feature, a second visually distinct spectral feature, and a third visually distinct spectral feature,
the first visually distinct spectral feature being identifiable as a local maximum at about 450 nm,
the second visually distinct spectral feature being identifiable as a shoulder at about 550 nm, and
the third visually distinct spectral feature being identifiable as a local maximum at about 600 nm.

63. The light emitting device of claim 62 further comprising:
a light propagation medium optically coupled to said fluorescent layer to transmit the first light, second light, and third light as composite output light in a direction away from the light source, the composite output light having a color characteristic at least partially determined by intensities of the first light, second light, and third light.

64. The light emitting device of claim 63 wherein the composite output light has a color rendering index greater than 75.

65. The light emitting device of claim 63 wherein the composite output light has a luminous efficiency greater than 320 lumens per watt.

66. The light emitting device of claim 62 wherein the second fluorescent material radiates the third light in response to the first light.

67. The light emitting device of claim 62 wherein the second fluorescent material radiates the third light in response to the second light.

68. The light emitting device of claim 62 wherein the second fluorescent material comprises $(Sr_{1-x-y-z}Ba_xCa_y)_2Si_{5N8}$:$Eu_z^{2+}$ where $0 \le x$, $y \le 0.5$ and $0 \le z \le 0.1$.

69. The light emitting device of claim 62 wherein the first fluorescent material comprises Yttrium Aluminum Garnet (YAG).

70. The light emitting device of claim 62 wherein the light source comprises a III-nitride light emitting diode.

71. The light emitting device of claim 62 wherein:
the first fluorescent material is cerium activated yttrium aluminum garnet; and
the first fluorescent material comprises between 5 and 25 weight percent of the fluorescent layer.

72. The light emitting device of claim 62 wherein:
the second fluorescent material is europium activated nitrido silicate; and
the second fluorescent material comprises between 3 and 24 weight percent of the fluorescent layer.

73. The light emitting device of claim 62 wherein:
the fluorescent layer further comprises dispersing material, and the dispersing material comprises between 38 and 92 weight percent of the fluorescent layer.

74. The light emitting device of claim 62 wherein a transparent material separates the light source from the fluorescent layer.

75. The light emitting device of claim 62 wherein the second fluorescent material comprises europium activated nitrido-silicate.

76. The light emitting device of claim 1 wherein:
the first fluorescent material is cerium activated yttrium aluminum garnet; and
the first fluorescent material comprises between 5 and 25 weight percent of the fluorescent layer.

77. The light emitting device of claim 1 wherein:
the second fluorescent material is europium activated nitrido silicate; and
the second fluorescent material comprises between 3 and 24 weight percent of the fluorescent layer.

78. The light emitting device of claim 2 wherein the composite output light has a luminous efficiency greater than 320 lumens per watt.

* * * * *